(12) United States Patent
Liao et al.

(10) Patent No.: US 8,212,339 B2
(45) Date of Patent: Jul. 3, 2012

(54) SEMICONDUCTOR DEVICE PACKAGES WITH ELECTROMAGNETIC INTERFERENCE SHIELDING

(75) Inventors: Kuo-Hsien Liao, Taichung (TW);
Jian-Cheng Chen, Tainan County (TW);
Chen-Chuan Fan, Tainan County (TW);
Chi-Tsung Chiu, Kaohsiung (TW);
Chih-Pin Hung, Koahsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 0 days.

(21) Appl. No.: 12/770,645

(22) Filed: Apr. 29, 2010

(65) Prior Publication Data
US 2010/0207259 A1     Aug. 19, 2010

Related U.S. Application Data

(63) Continuation-in-part of application No. 12/489,115, filed on Jun. 22, 2009, now Pat. No. 7,989,928, which is a continuation-in-part of application No. 12/336,400, filed on Dec. 16, 2008.

(60) Provisional application No. 61/006,894, filed on Feb. 5, 2008.

(30) Foreign Application Priority Data

Apr. 30, 2008   (TW) ................................ 97115985 A

(51) Int. Cl.
*H01L 23/552*     (2006.01)
*H01L 21/78*     (2006.01)

(52) U.S. Cl. ................ 257/659; 257/660; 257/E23.114; 257/E23.115; 257/E21.499; 438/121

(58) Field of Classification Search .................. 257/659, 257/660, E23.114, E23.115, E21.499; 438/121
See application file for complete search history.

(56) References Cited

U.S. PATENT DOCUMENTS

| | | | |
|---|---|---|---|
| 3,390,226 A | 6/1968 | Beyerlein | |
| 4,569,786 A | 2/1986 | Deguchi | |
| 4,717,948 A | 1/1988 | Sakai et al. | |
| 4,814,205 A | 3/1989 | Arcilesi et al. | |

(Continued)

FOREIGN PATENT DOCUMENTS

CN        1442033 A      9/2003

(Continued)

OTHER PUBLICATIONS

Lee et al. "Semiconductor Device Packages With Electromagnetic Interference Shielding." U.S. Appl. No. 12/622,419, filed Nov. 19, 2009.

(Continued)

*Primary Examiner* — Eugene Lee
*Assistant Examiner* — Peniel M Gumedzoe
(74) *Attorney, Agent, or Firm* — Foley & Lardner LLP

(57) ABSTRACT

Described herein are semiconductor device packages with EMI shielding and related methods. In one embodiment, a semiconductor device package includes a grounding element disposed adjacent to a periphery of a substrate unit and at least partially extending between an upper surface and a lower surface of the substrate unit. The grounding element includes an indented portion that is disposed adjacent to a lateral surface of the substrate unit. The semiconductor device package also includes an EMI shield that is electrically connected to the grounding element and is inwardly recessed adjacent to the indented portion of the grounding element.

20 Claims, 10 Drawing Sheets

U.S. PATENT DOCUMENTS

| | | | |
|---|---|---|---|
| 4,821,007 A | 4/1989 | Fields et al. |
| 5,104,745 A | 4/1992 | Cave et al. |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,557,142 A | 9/1996 | Gilmore et al. |
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,761 A | 12/1997 | Heiss |
| 5,726,612 A | 3/1998 | Mandai |
| 5,729,437 A | 3/1998 | Hashimoto |
| 5,776,798 A | 7/1998 | Quan et al. |
| 5,847,930 A | 12/1998 | Kazle |
| 5,864,088 A | 1/1999 | Sato et al. |
| 5,886,876 A | 3/1999 | Yamaguchi |
| 5,895,229 A | 4/1999 | Carney et al. |
| 5,898,344 A | 4/1999 | Hayashi |
| 5,966,052 A | 10/1999 | Sakai |
| 5,977,626 A | 11/1999 | Wang et al. |
| 5,998,867 A | 12/1999 | Jensen et al. |
| 6,079,099 A | 6/2000 | Uchida et al. |
| 6,093,972 A | 7/2000 | Carney et al. |
| 6,150,193 A | 11/2000 | Glenn |
| 6,194,250 B1 | 2/2001 | Melton et al. |
| 6,225,694 B1 | 5/2001 | Terui |
| 6,255,143 B1 | 7/2001 | Briar |
| 6,261,680 B1 | 7/2001 | Denman |
| 6,369,335 B1 | 4/2002 | Wajima |
| 6,376,769 B1 | 4/2002 | Chung |
| 6,448,632 B1 | 9/2002 | Takiar et al. |
| 6,455,864 B1 | 9/2002 | Featherby et al. |
| 6,472,598 B1 | 10/2002 | Glenn |
| 6,472,743 B2 | 10/2002 | Huang et al. |
| 6,479,903 B2 | 11/2002 | Briar |
| 6,492,194 B1 | 12/2002 | Bureau et al. |
| 6,521,978 B2 | 2/2003 | Fenk et al. |
| 6,566,596 B1 | 5/2003 | Askew |
| 6,586,822 B1 | 7/2003 | Vu et al. |
| 6,602,737 B2 | 8/2003 | Wu |
| 6,614,102 B1 | 9/2003 | Hoffman et al. |
| 6,635,953 B2 | 10/2003 | Wu |
| 6,686,649 B1 | 2/2004 | Mathews et al. |
| 6,695,985 B2 | 2/2004 | Igarashi et al. |
| 6,740,546 B2 | 5/2004 | Corisis et al. |
| 6,740,959 B2 | 5/2004 | Alcoe et al. |
| 6,757,181 B1 | 6/2004 | Villanueva |
| 6,781,231 B2 | 8/2004 | Minervini |
| 6,800,804 B2 | 10/2004 | Igarashi et al. |
| 6,838,776 B2 | 1/2005 | Leal et al. |
| 6,856,007 B2 | 2/2005 | Warner |
| 6,865,084 B2 | 3/2005 | Lin et al. |
| 6,867,480 B2 | 3/2005 | Legaspi, Jr. et al. |
| 6,881,896 B2 | 4/2005 | Ebihara |
| 6,900,383 B2 | 5/2005 | Babb et al. |
| 6,928,719 B2 | 8/2005 | Kim et al. |
| 6,962,869 B1 | 11/2005 | Bao et al. |
| 6,967,403 B2 | 11/2005 | Chuang et al. |
| 6,975,516 B2 | 12/2005 | Asahi et al. |
| 6,992,400 B2 | 1/2006 | Tikka et al. |
| 6,998,532 B2 | 2/2006 | Kawamoto et al. |
| 7,012,323 B2 | 3/2006 | Warner et al. |
| 7,030,469 B2 | 4/2006 | Mahadevan et al. |
| 7,045,385 B2 | 5/2006 | Kim et al. |
| 7,049,682 B1 | 5/2006 | Mathews et al. |
| 7,081,661 B2 | 7/2006 | Takehara et al. |
| 7,125,744 B2 | 10/2006 | Takehara et al. |
| 7,126,218 B1 | 10/2006 | Darveaux et al. |
| 7,161,252 B2 | 1/2007 | Tsuneoka et al. |
| 7,180,012 B2 | 2/2007 | Tsuneoka et al. |
| 7,183,498 B2 | 2/2007 | Ogura et al. |
| 7,186,928 B2 | 3/2007 | Kikuchi et al. |
| 7,187,060 B2 | 3/2007 | Usui |
| 7,294,587 B2 | 11/2007 | Asahi et al. |
| 7,327,015 B2 | 2/2008 | Yang et al. |
| 7,342,303 B1 | 3/2008 | Berry et al. |
| 7,372,151 B1 | 5/2008 | Fan et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,566,955 B2 | 7/2009 | Warner et al. |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 7,643,311 B2 | 1/2010 | Coffy |
| 7,656,047 B2 | 2/2010 | Yang et al. |
| 7,700,411 B2 | 4/2010 | Yang et al. |
| 7,741,151 B2 | 6/2010 | Amrine et al. |
| 7,745,910 B1 | 6/2010 | Olson et al. |
| 7,772,046 B2 | 8/2010 | Pagaila et al. |
| 7,829,981 B2 | 11/2010 | Hsu |
| 2002/0053724 A1 | 5/2002 | Lai et al. |
| 2002/0093108 A1 | 7/2002 | Grigorov |
| 2004/0020673 A1 | 2/2004 | Mazurkiewicz |
| 2004/0063242 A1 | 4/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0208702 A1 | 9/2005 | Kim |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0266547 A1 | 11/2006 | Koga |
| 2007/0030661 A1 | 2/2007 | Morris et al. |
| 2007/0241437 A1 | 10/2007 | Kagaya et al. |
| 2008/0042301 A1 | 2/2008 | Yang et al. |
| 2008/0061407 A1 | 3/2008 | Yang et al. |
| 2008/0128890 A1 | 6/2008 | Choi et al. |
| 2008/0174013 A1 | 7/2008 | Yang et al. |
| 2008/0210462 A1* | 9/2008 | Kawagishi et al. ......... 174/377 |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0075428 A1 | 3/2009 | Tang et al. |
| 2009/0102003 A1 | 4/2009 | Vogt et al. |
| 2009/0102033 A1 | 4/2009 | Raben |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chang Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2009/0261470 A1 | 10/2009 | Choi et al. |
| 2009/0294928 A1 | 12/2009 | Kim et al. |
| 2009/0302446 A1 | 12/2009 | Lee et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1 | 5/2010 | Ko et al. |
| 2010/0110656 A1 | 5/2010 | Ko et al. |
| 2010/0207257 A1 | 8/2010 | Lee |
| 2010/0207258 A1 | 8/2010 | Eun et al. |
| 2011/0006408 A1 | 1/2011 | Liao |

FOREIGN PATENT DOCUMENTS

| | | |
|---|---|---|
| CN | 1774804 A | 5/2006 |
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |
| JP | 2008-288686 | 1/1996 |
| JP | 2003273571 | 9/2003 |
| WO | WO2004600034 | 7/2004 |
| WO | WO 2006076613 | 7/2006 |

OTHER PUBLICATIONS

Kim et al. "Semiconductor Device Packages With Electromagnetic Interference Shielding." U.S. Appl. No. 12/622,415, filed Nov. 19, 2009.

Chiu et al. "Wafer-Level Semiconductor Device Packages With Electromagnetic Interference Shielding." U.S. Appl. No. 12/622,393, filed Nov. 19, 2009.

Weng et al., "Semiconductor Package and Manufacturing Methods Thereof." U.S. Appl. No. 12/955,782, filed Nov. 29, 2009.

Chiu et al. "Semiconductor Device Packages With Electromagnetic Interference Shielding" U.S. Appl. No. 12/336,400, filed Dec. 16, 2008 Office Actions mailed Oct. 29, 2009, Apr. 12, 2010, Jun. 29, 2010.

Liao et al. "Semiconductor Device Packages With Electromagnetic Interference Shielding." U.S. Appl. No. 12/489,115, filed Jun. 22, 2009. Office Actions mailed Nov. 12, 2009, Apr. 9, 2010, Jun. 29, 2010; Notices of Allowance mailed Oct. 25, 2010; Mar. 10, 2011.

Chiu et al. "Semiconductor Device Packages With Electromagnetic Interference Shielding" U.S. Appl. No. 12/336,407, filed Dec. 16, 2008. Office Actions mailed Mar. 24, 2010; Jul. 27, 2010; Dec. 2, 2010.

Ko et al., U.S. Appl. No. 12/414,996, filed Mar. 31, 2009 for "Chip Package and Manufacturing Method Thereof." Office Actions mailed Jan. 11, 2011 and Jun. 22, 2011; Interview Summary & Office Action Appendix Aug. 18, 2011; Notice of Allowance Sep. 8, 2011; Responses filed Apr. 11, 2011; Aug. 22, 2011.

* cited by examiner

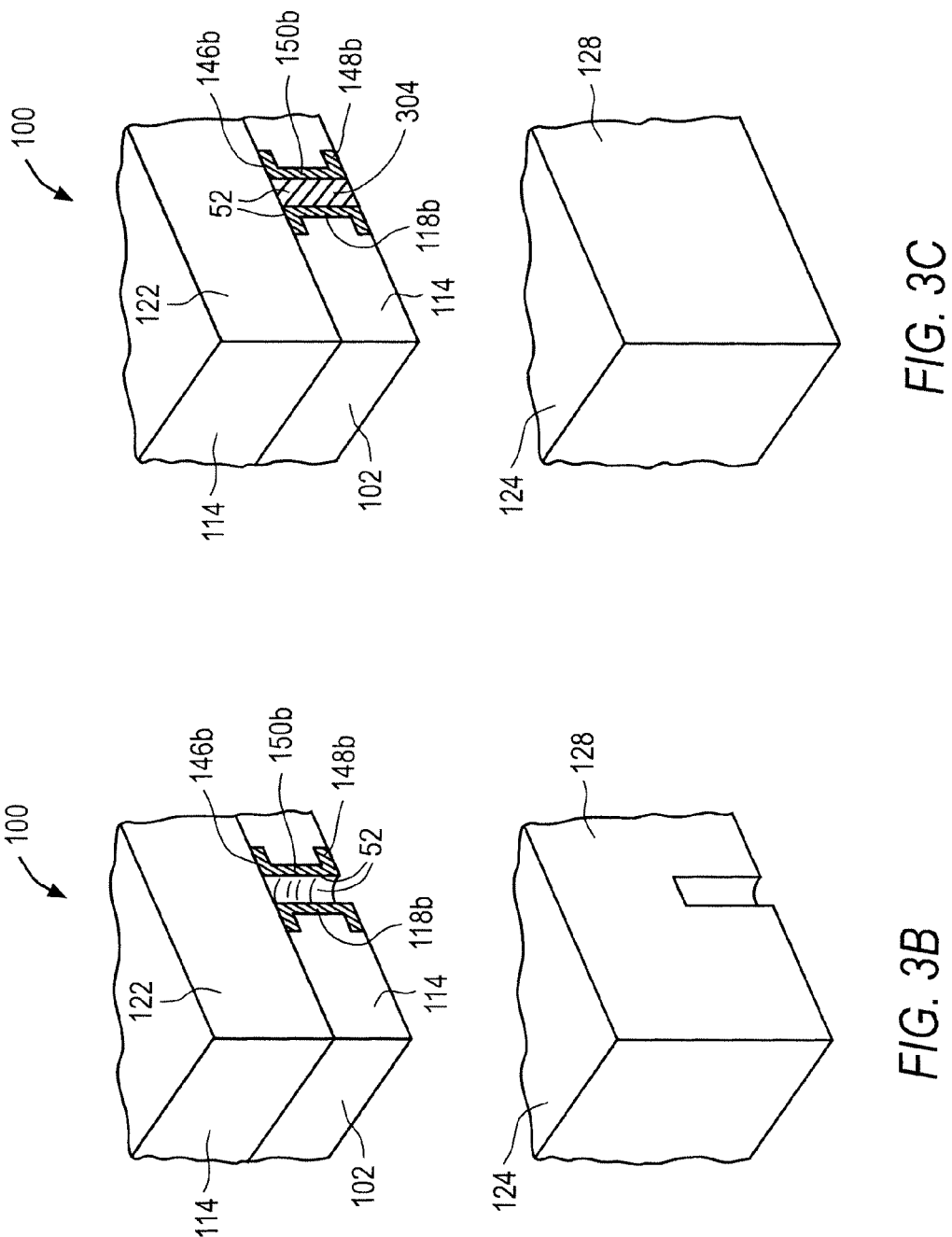

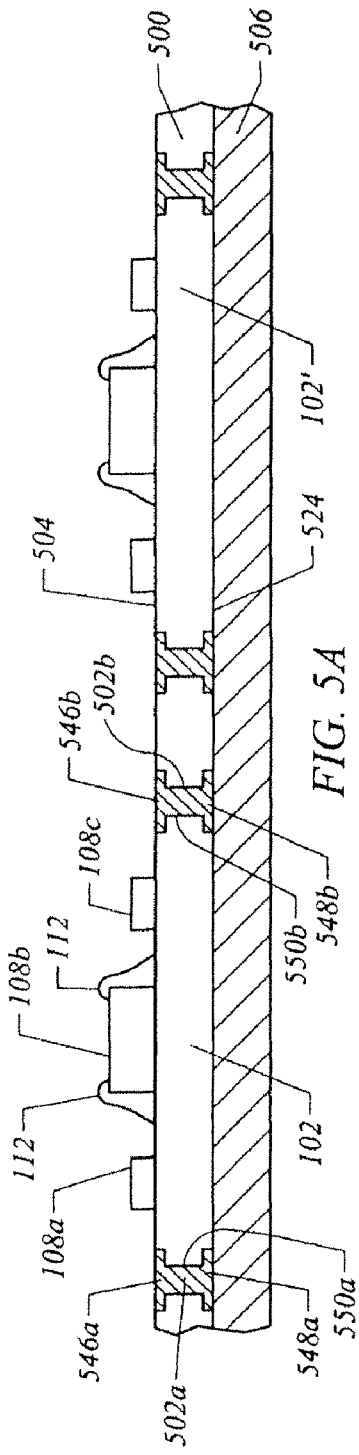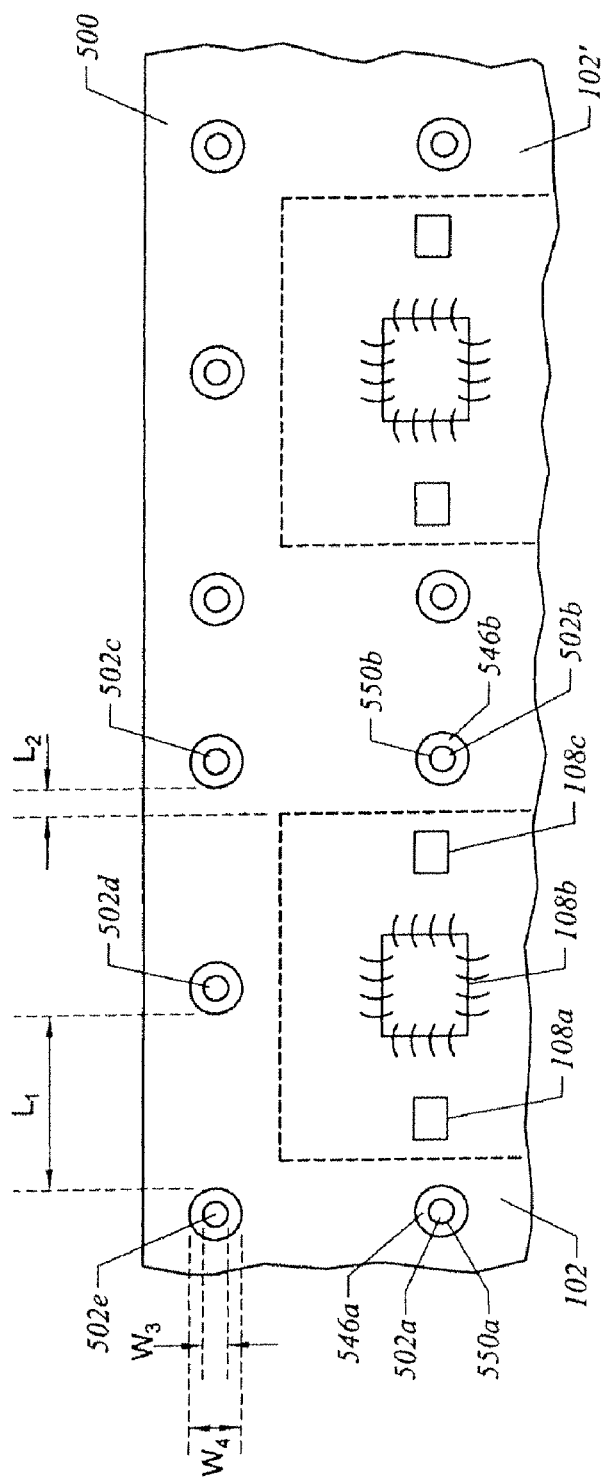
FIG. 5A
FIG. 5B

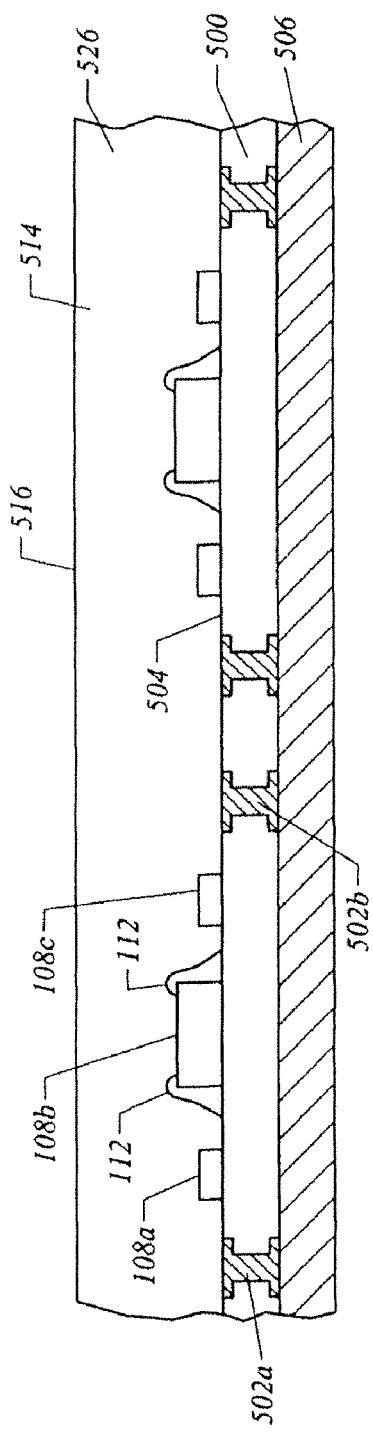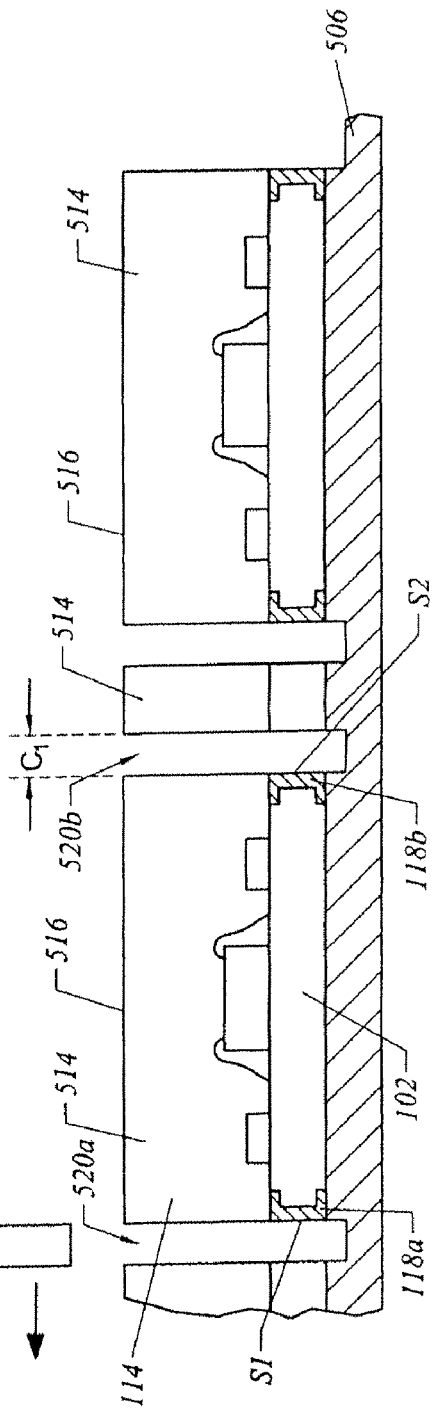
FIG. 5C
FIG. 5D

SEMICONDUCTOR DEVICE PACKAGES WITH ELECTROMAGNETIC INTERFERENCE SHIELDING

CROSS REFERENCE TO RELATED APPLICATIONS

This application is a continuation-in-part of U.S. patent application Ser. No. 12/489,115, filed on Jun. 22, 2009 now U.S. Pat. No. 7,989,928, which is a continuation-in-part of U.S. patent application Ser. No. 12/336,400, filed on Dec. 16, 2008, which claims the benefit of U.S. Provisional Application Ser. No. 61/006,894, filed on Feb. 5, 2008, and the benefit of Taiwan Application Serial No. 97115985, filed on Apr. 30, 2008, the disclosures of which are incorporated herein by reference in their entireties.

FIELD OF THE INVENTION

The invention relates generally to semiconductor device packages. More particularly, the invention relates to semiconductor device packages with electromagnetic interference shielding.

BACKGROUND

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference ("EMI"). Smaller sizes of semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

While an electrically conductive casing can reduce EMI, the use of the casing can suffer from a number of disadvantages. In particular, the casing is typically secured to an exterior of a semiconductor device package by an adhesive. Unfortunately, the casing can be prone to peeling or falling off, since binding characteristics of the adhesive can be adversely affected by temperature, humidity, and other environmental conditions. Also, when securing the casing to the package, the size and shape of the casing and the size and shape of the package should match within relatively small tolerance levels. This matching of sizes and shapes and associated precision in relative positioning of the casing and the package can render manufacturing operations costly and time consuming. Because of this matching of sizes and shapes, it also follows that semiconductor device packages of different sizes and shapes can require different casings, which can further increase manufacturing cost and time to accommodate the different packages.

It is against this background that a need arose to develop the semiconductor device packages and related methods described herein.

SUMMARY

One aspect of the invention relates to semiconductor device packages with EMI shielding. In one embodiment, a semiconductor device package includes: (1) a substrate unit including (a) an upper surface, (b) a lower surface, (c) a lateral surface disposed adjacent to a periphery of the substrate unit and fully extending between the upper surface and the lower surface of the substrate unit, and (d) a grounding element disposed adjacent to the periphery of the substrate unit and at least partially extending between the upper surface and the lower surface of the substrate unit, the grounding element including an indented portion that is disposed adjacent to the lateral surface of the substrate unit; (2) a semiconductor device disposed adjacent to the upper surface of the substrate unit and electrically connected to the substrate unit; (3) a package body disposed adjacent to the upper surface of the substrate unit and covering the semiconductor device, the package body including exterior surfaces that include a lateral surface; and (4) an EMI shield disposed adjacent to the exterior surfaces of the package body and the lateral surface of the substrate unit, the EMI shield being electrically connected to the grounding element and being inwardly recessed adjacent to the indented portion of the grounding element.

In another embodiment, the semiconductor device package includes: (1) a substrate unit including (a) a first surface, (b) a second opposing surface, and (c) a grounding element at least partially extending between the first surface and the second opposing surface of the substrate unit, the grounding element including a plated channel remnant and a filler member, the plated channel remnant being inwardly recessed so as to accommodate the filler member, the plated channel remnant and the filler member defining a lateral surface of the grounding element that is disposed adjacent to a periphery of the substrate unit; (2) a semiconductor device disposed adjacent to the first surface of the substrate unit and electrically connected to the substrate unit; (3) a package body disposed adjacent to the first surface of the substrate unit and covering the semiconductor device, the package body including exterior surfaces; and (4) an EMI shield disposed adjacent to the exterior surfaces of the package body and electrically connected to the lateral surface of the grounding element, wherein a lateral profile of the semiconductor device package is substantially planar and is substantially orthogonal with respect to the second opposing surface of the substrate unit.

Another aspect of the invention relates to methods of forming semiconductor device packages with EMI shielding. In one embodiment, a method includes: (1) providing a substrate including a grounding via and a core member, the grounding via at least partially extending between an upper surface and a lower surface of the substrate, the grounding via defining a via channel that is substantially filled by the core member; (2)

electrically connecting a semiconductor device to the upper surface of the substrate; (3) applying a molding material to the upper surface of the substrate to form a molded structure covering the semiconductor device; (4) forming cutting slits fully extending through the molded structure and the substrate, the cutting slits being aligned with the substrate, such that: (a) the substrate is sub-divided to form a separated substrate unit; (b) the molded structure is sub-divided to form a separated package body disposed adjacent to the substrate unit, the package body including exterior surfaces; and (c) a remnant of the grounding via and a remnant of the core member correspond to a grounding element disposed adjacent to a periphery of the substrate unit, the grounding element including an exposed connection surface; and (5) subsequent to forming the cutting slits, applying an EMI coating to the exterior surfaces of the package body and the connection surface of the grounding element to form an EMI shield.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

FIG. 3B illustrates an enlarged, perspective view of one implementation of the semiconductor device package of FIG. 1.

FIG. 3C illustrates an enlarged, perspective view of another implementation of the semiconductor device package of FIG. 1.

FIG. 5A through FIG. 5E illustrate a method of forming the semiconductor device package of FIG. 1, according to an embodiment of the invention.

DETAILED DESCRIPTION

Definitions

Figure 1:
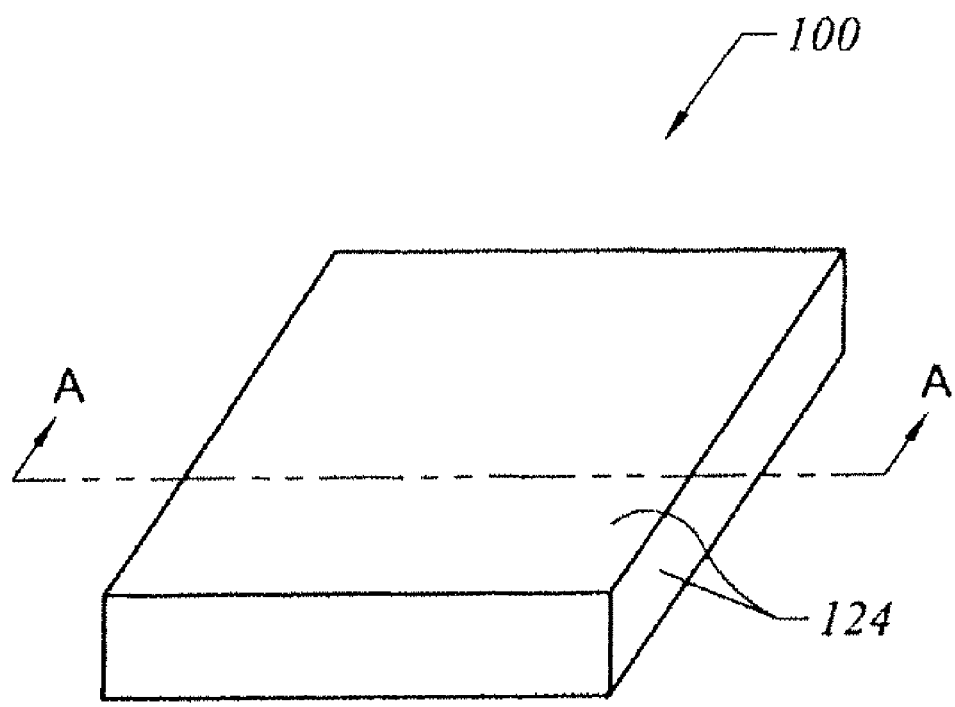
FIG. 1 illustrates a perspective view of a semiconductor device package implemented in accordance with an embodiment of the invention.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a grounding element can include multiple grounding elements unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "inward," "inwardly," "outer," "exterior," "outward," "outwardly," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current, while the terms "electrically non-conductive" and "electrical non-conductivity" refer to a lack of ability to transport an electric current. Electrically conductive materials typically correspond to those materials that exhibit little or no opposition to flow of an electric current, while electrically non-conductive materials typically correspond to those materials within which an electric current has little or no tendency to flow. One measure of electrical conductivity (or electrical non-conductivity) is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$, while an electrically non-conductive material is one having a conductivity less than about $10^4$ $S \cdot m^{-1}$, such as no greater than about $10^3$ $S \cdot m^{-1}$ or no greater than about $10^2$ $S \cdot m^{-1}$ Electrical conductivity of a material can sometimes vary with temperature. Unless otherwise specified, electrical conductivity of a material is defined at room temperature.

Figure 2:
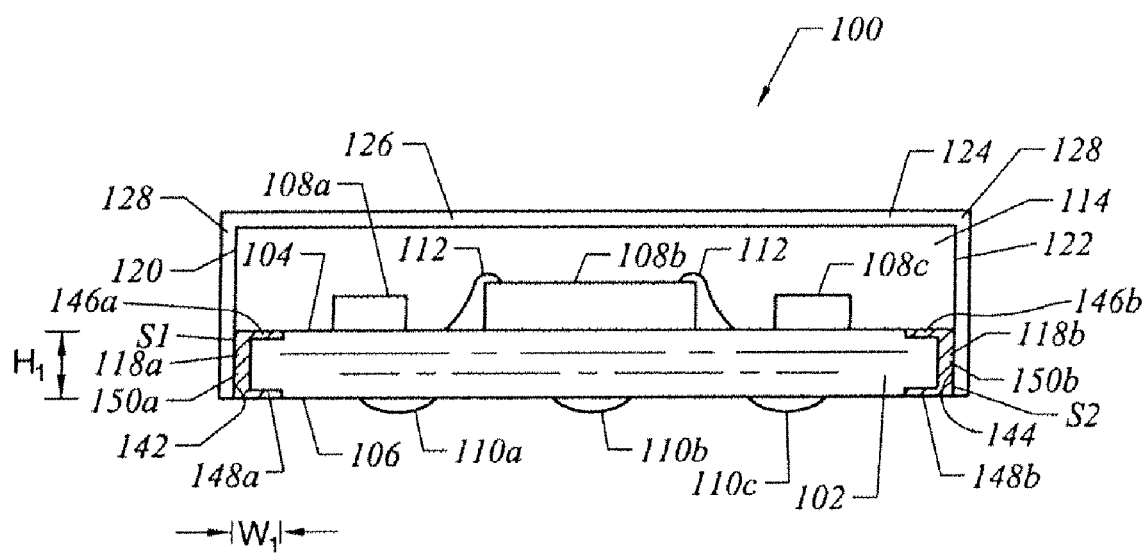
FIG. 2 illustrates a cross-sectional view of the semiconductor device package of FIG. 1, taken along line A-A of FIG. 1.

Attention first turns to FIG. 1 and FIG. 2, which illustrate a semiconductor device package 100 implemented in accordance with an embodiment of the invention. In particular, FIG. 1 illustrates a perspective view of the package 100, while FIG. 2 illustrates a cross-sectional view of the package 100, taken along line A-A of FIG. 1.

In the illustrated embodiment, sides of the package 100 are substantially planar and have a substantially orthogonal orientation so as to define a lateral profile that extends around substantially an entire periphery of the package 100. Advantageously, this orthogonal lateral profile allows a reduced overall package size by reducing or minimizing a footprint area of the package 100. However, it is contemplated that the lateral profile of the package 100, in general, can be any of a number of shapes, such as curved, inclined, stepped, or roughly textured. It is also contemplated that the lateral profile of the package 100 can be substantially planar, albeit inwardly recessed at a set of locations as further described below.

Referring to FIG. 2, the package 100 includes a substrate unit 102, which includes an upper surface 104, a lower surface 106, and lateral surfaces 142 and 144 disposed adjacent to sides of the substrate unit 102 and extending between the upper surface 104 and the lower surface 106. In the illustrated embodiment, the lateral surfaces 142 and 144 are substantially planar and have a substantially orthogonal orientation with respect to the upper surface 104 or the lower surface 106, although it is contemplated that the shapes and orientations of the lateral surfaces 142 and 144 can vary for other implementations. The substrate unit 102 can be implemented in a number of ways, and includes electrical interconnect to provide electrical pathways between the upper surface 104 and the lower surface 106 of the substrate unit 102. The electrical interconnect can include, for example, a set of electrically conductive layers that are incorporated within a set of dielectric layers. The electrically conductive layers can be connected to one another by internal vias, and can be implemented so as to sandwich a core formed from a suitable resin, such as one based on bismaleimide and triazine or based on epoxy and polyphenylene oxide. For example, the substrate unit 102 can include a substantially slab-shaped core that is sandwiched by one set of electrically conductive layers disposed adjacent to an upper surface of the core and another set of electrically conductive layers disposed adjacent to a lower surface of the core. For certain implementations, a thickness of the substrate unit 102, namely a distance between the upper surface 104 and the lower surface 106 of the substrate unit 102, can be in the range of about 0.1 millimeter ("mm") to about 2 mm, such as from about 0.2 mm to about 1.5 mm or from about 0.4 mm to about 0.6 mm. While not illustrated in FIG. 2, it is contemplated that a solder mask layer can be disposed adjacent to either, or both, the upper surface 104 and the lower surface 106 of the substrate unit 102.

As illustrated in FIG. 2, the substrate unit 102 includes grounding elements 118a and 118b, which are disposed adjacent to a periphery of the substrate unit 102. More particularly, the grounding elements 118a and 118b are disposed substantially at the periphery of the substrate unit 102, and are disposed adjacent to the lateral surfaces 142 and 144, respectively. The grounding elements 118a and 118b are connected to other electrical interconnect included in the substrate unit 102 and, as further described below, provide electrical pathways to reduce EMI. In the illustrated embodiment, the grounding elements 118a and 118b are implemented as grounding vias and, more particularly, as remnants of grounding vias in accordance with a set of singulation operations as further described below. Referring to FIG. 2, each of the grounding elements 118a and 118b includes an upper via pad remnant 146a or 146b, which is disposed adjacent to the upper surface 104 of the substrate unit 102, a lower via pad remnant 148a or 148b, which is disposed adjacent to the lower surface 106 of the substrate unit 102, and a plated channel remnant 150a or 150b, which extends between the upper via pad remnant 146a or 146b and the lower via pad remnant 148a or 148b. While the grounding elements 118a and 118b are illustrated as fully extending between the upper surface 104 and the lower surface 106 of the substrate unit 102, it is contemplated that the extent of the grounding elements 118a and 118b can vary for other implementations.

Still referring to FIG. 2, the grounding elements 118a and 118b include connection surfaces S1 and S2, respectively, which are lateral surfaces that face away from an interior of the package 100 and are disposed adjacent to the periphery of the substrate unit 102. More particularly, the connection surfaces S1 and S2 are electrically exposed substantially at the periphery of the substrate unit 102, and are electrically exposed adjacent to the lateral surfaces 142 and 144, respectively. In the illustrated embodiment, the connection surfaces S1 and S2 correspond to electrically exposed surfaces of the upper via pad remnants 146a and 146b, the lower via pad remnants 148a and 148b, and the plated channel remnants 150a and 150b. Advantageously, the relatively large areas of the connection surfaces S1 and S2 can enhance reliability and efficiency of electrical connections for reducing EMI. The grounding elements 118a and 118b are formed from a metal, a metal alloy, a matrix with a metal or a metal alloy dispersed therein, or another suitable electrically conductive material. For certain implementations, a height $H_1$ of the grounding elements 118a and 118b, namely a vertical extent of the grounding elements 118a and 118b, can be substantially the same as the thickness of the substrate unit 102, and can be in the range of about 0.1 mm to about 2 mm, such as from about 0.2 mm to about 1.5 mm or from about 0.4 mm to about 0.6 mm. A width $W_1$ of the grounding elements 118a and 118b, namely a lateral extent adjacent to the upper surface 104 or the lower surface 106, can be in the range of about 75 micrometer ("μm") to about 275 μm, such as from about 100 μm to about 250 μm or from about 125 μm to about 225 μm.

As illustrated in FIG. 2, the package 100 also includes semiconductor devices 108a, 108b, and 108c, which are disposed adjacent to the upper surface 104 of the substrate unit 102, and electrical contacts 110a, 110b, and 110c, which are disposed adjacent to the lower surface 106 of the substrate unit 102. The semiconductor device 108b is wire-bonded to the substrate unit 102 via a set of wires 112, which are formed from gold or another suitable electrically conductive material, and the semiconductor devices 108a and 108c are surface mounted to the substrate unit 102. In the illustrated embodiment, the semiconductor device 108b is a semiconductor chip, while the semiconductor devices 108a and 108c are passive devices, such as resistors, capacitors, or inductors. The electrical contacts 110a, 110b, and 110c provide input and output electrical connections for the package 100, and at least a subset of the electrical contacts 110a, 110b, and 110c are electrically connected to the semiconductor devices 108a, 108b, and 108c via electrical interconnect included in the substrate unit 102. In the illustrated embodiment, at least one of the electrical contacts 110a, 110b, and 110c is a ground electrical contact, and is electrically connected to the grounding elements 118a and 118b via electrical interconnect included in the substrate unit 102. While three semiconductor devices are illustrated in FIG. 2, it is contemplated that more or less semiconductor devices can be included for other implementations, and that semiconductor devices, in general, can be any active devices, any passive devices, or combinations thereof. It is also contemplated that the number of electrical contacts can vary from that illustrated in FIG. 2.

Still referring to FIG. 2, the package 100 also includes a package body 114 that is disposed adjacent to the upper surface 104 of the substrate unit 102. In conjunction with the substrate unit 102, the package body 114 substantially covers or encapsulates the grounding elements 118a and 118b, the semiconductor devices 108a, 108b, and 108c, and the wires 112 to provide mechanical stability as well as protection against oxidation, humidity, and other environmental conditions. The package body 114 is formed from a molding material, and includes exterior surfaces, including lateral surfaces 120 and 122 disposed adjacent to sides of the package body 114. In the illustrated embodiment, the lateral surfaces 120 and 122 are substantially planar and have a substantially orthogonal orientation with respect to the upper surface 104 or the lower surface 106, although it is contemplated that the lateral surfaces 120 and 122 can be curved, inclined, stepped, or roughly textured for other implementations. Also, the lateral surfaces 120 and 122 are substantially aligned or co-planar with the lateral surfaces 142 and 144, respectively. More particularly, this alignment is accomplished while allowing the connection surfaces S1 and S2 to be electrically exposed, such as by reducing or minimizing coverage of the connection surfaces S1 and S2 by the package body 114. For other implementations, it is contemplated that the shape of the lateral surfaces 120 and 122 and their alignment with the lateral surfaces 142 and 144 can be varied from that illustrated in FIG. 2, while allowing the connection surfaces S1 and S2 to be at least partially electrically exposed.

As illustrated in FIG. 1 and FIG. 2, the package 100 further includes an EMI shield 124 that is disposed adjacent to the exterior surfaces of the package body 114, the connection surfaces S1 and S2 of the grounding elements 118a and 118b, and the lateral surfaces 142 and 144 of the substrate unit 102. The EMI shield 124 is formed from an electrically conductive material, and substantially surrounds the semiconductor devices 108a, 108b, and 108c within the package 100 to provide protection against EMI. In the illustrated embodiment, the EMI shield 124 includes an upper portion 126 and a lateral portion 128, which extends around substantially the entire periphery of the package body 114 and defines the orthogonal lateral profile of the package 100. As illustrated in FIG. 2, the lateral portion 128 extends downwardly from the upper portion 126 and along the lateral surfaces 142 and 144 of the substrate unit 102, and includes a lower end that is substantially aligned or co-planar with the lower surface 106 of the substrate unit 102. However, it is contemplated that the extent of the lateral portion 128 and the alignment of its lower end with the lower surface 106 can be varied for other implementations.

As illustrated in FIG. 2, the EMI shield 124 is electrically connected to the connection surfaces S1 and S2 of the grounding elements 118a and 118b. When electromagnetic emissions radiated from an interior of the package 100 strike the EMI shield 124, at least a portion of these emissions can be efficiently grounded via the grounding elements 118a and 118b, thereby reducing the level of emissions that can pass through the EMI shield 124 and adversely affect neighboring semiconductor devices. Similarly, when electromagnetic emissions from a neighboring semiconductor device strike the EMI shield 124, a similar grounding can occur to reduce EMI of the semiconductor devices 108a, 108b, and 108c within the package 100. During operation, the package 100 can be disposed on a printed circuit board ("PCB") and electrically connected to the PCB via the electrical contacts 110a, 110b, and 110c. As previously described, at least one of the electrical contacts 110a, 110b, and 110c is a ground electrical contact, and the ground electrical contact can be electrically connected to a ground voltage provided by the PCB. Grounding of electromagnetic emissions incident upon the EMI shield 124 can occur through an electrical pathway including the grounding elements 118a and 118b, other electrical interconnect included in the substrate unit 102, and the ground electrical contact. Because the lower end of the EMI shield 124 is substantially aligned with the lower surface 106 of the substrate unit 102, the lower end also can be electrically connected to a ground voltage provided by the PCB, thereby providing an alternative electrical pathway for grounding undesired electromagnetic emissions. Alternatively, or in conjunction, the lower via pad remnants 148a and 148b can be electrically connected to a ground voltage provided by the PCB.

In the illustrated embodiment, the EMI shield 124 is a conformal shield that is formed as a set of layers or films. Advantageously, the EMI shield 124 can be formed adjacent to and in direct contact with an exterior of the package 100 without the use of an adhesive, thereby enhancing reliability and resistance to temperature, humidity, and other environmental conditions. Also, the conformal characteristics of the EMI shield 124 allow similar EMI shields and similar manufacturing operations to be readily applied to semiconductor device packages of different sizes and shapes, thereby reducing manufacturing cost and time to accommodate the different packages. For certain implementations, a thickness of the EMI shield 124 can be in the range of about 1 μm to about 500 μm, such as from about 1 μm to about 100 μm, from about 1 μm to about 50 μm, or from about 1 μm to about 10 μm. Such reduced thickness of the EMI shield 124, relative to a typical casing, allows a reduced overall package size, and is a further advantage of the illustrated embodiment.

Figure 3A:
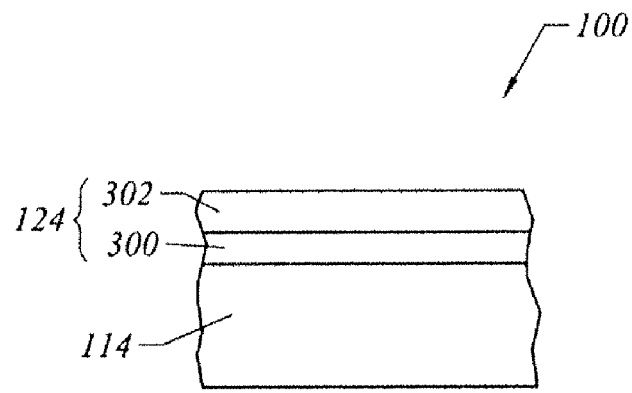
FIG. 3A illustrates an enlarged, cross-sectional view of a portion of the semiconductor device package of FIG. 1.

Attention next turns to FIG. 3A, which illustrates an enlarged, cross-sectional view of a portion of the package 100 of FIG. 1 and FIG. 2. In particular, FIG. 3A illustrates a particular implementation of the EMI shield 124 that is disposed adjacent to the package body 114.

As illustrated in FIG. 3A, the EMI shield 124 is multi-layered and includes an inner layer 300, which is disposed adjacent to the package body 114, and an outer layer 302, which is disposed adjacent to the inner layer 300 and is exposed at the exterior of the package 100. In general, each of the inner layer 300 and the outer layer 302 can be formed from a metal, a metal alloy, a matrix with a metal or a metal alloy dispersed therein, or another suitable electrically conductive material. For example, each of the inner layer 300 and the outer layer 302 can be formed from aluminum, copper, chromium, tin, gold, silver, nickel, stainless steel, or a combination thereof. The inner layer 300 and the outer layer 302 can be formed from the same electrically conductive material or different electrically conductive materials. For example, a metal, such as nickel, can be selected for both the inner layer 300 and the outer layer 302. In some instances, different electrically conductive materials can be selected for the inner layer 300 and the outer layer 302 to provide complementary functionalities. For example, a metal with a higher electrical conductivity, such as aluminum, copper, gold, or silver, can be selected for the inner layer 300 to provide EMI shielding functionality. On the other hand, a metal with a somewhat lower electrical conductivity, such as nickel, can be selected for the outer layer 302 to protect the inner layer 300 against oxidation, humidity, and other environmental conditions. In this case, the outer layer 302 also can contribute to the EMI shielding functionality, while providing the protection functionality. While two layers are illustrated in FIG. 3A, it is contemplated that more or less layers can be included for other implementations.

Attention next turns to FIG. 3B and FIG. 3C, which illustrate an enlarged, perspective view of a portion of the package 100 of FIG. 1 and FIG. 2. In particular, FIG. 3B illustrates one particular implementation of the grounding element 118b, while FIG. 3C illustrates another particular implementation of the grounding element 118b. For ease of presentation, the following features are described with reference to the grounding element 118b that is disposed adjacent to the lateral surface 144 of the substrate unit 102, although it is contemplated that the features can be similarly applicable to other grounding elements of the package 100, such as the grounding element 118a.

Referring first to FIG. 3B, the grounding element 118b is implemented as a remnant of a grounding via in accordance with a set of singulation operations, and includes the upper via pad remnant 146b, the lower via pad remnant 148b, and the plated channel remnant 150b. The plated channel remnant 150b corresponds to an indented portion of the grounding element 118b, and is inwardly recessed relative to the lateral surface 144 of the substrate unit 102. More particularly, the plated channel remnant 150b is inwardly recessed so as to define a cutout or a groove, which includes a lateral surface that is curved in a substantially concave manner and is electrically exposed to allow electrical connection to the EMI shield 124. As illustrated in FIG. 3B, the upper via pad remnant 146b, the lower via pad remnant 148b, and the plated channel remnant 150b include lateral surfaces that are substantially planar and are substantially aligned or co-planar with the lateral surface 144 of the substrate unit 102, and the connection surface S2 of the grounding element 118b includes the substantially concave, lateral surface of the plated channel remnant 150b as well as the substantially planar, lateral surfaces of the upper via pad remnant 146b, the lower via pad remnant 148b, and the plated channel remnant 150b. Advantageously, the inward recessing of the plated channel remnant 150b provides a relatively large area of the connection surface S2, thereby enhancing reliability and efficiency of electrical connections for reducing EMI. Still referring to FIG. 3B, formation of the EMI shield 124 yields the orthogonal lateral profile of the package 100 that is substantially planar, albeit inwardly recessed at a particular set of locations. In particular, the EMI shield 124 conformally coats the connection surface S2, which includes the substantially concave, lateral surface of the plated channel remnant 150, such that the lateral portion 128 of the EMI shield 124 is inwardly recessed adjacent to the plated channel remnant 150.

Turning next to FIG. 3C, the grounding element 118b is also implemented as a remnant of a grounding via in accordance with a set of singulation operations, and includes the upper via pad remnant 146b, the lower via pad remnant 148b, and the plated channel remnant 150b. Here, the grounding element 118b also includes a filler or plug member 304, which is accommodated by and substantially fills the cutout defined by the plated channel remnant 150b. As further described below, the filler member 304 is implemented as a remnant of a core member that is accommodated by and substantially fills a via channel defined by the grounding via, and carrying out a set of singulation operations yields a lateral surface of the filler member 304 that is substantially planar and is electrically exposed to allow electrical connection to the EMI shield 124. More particularly, the lateral surface of the filler member 304 is substantially aligned or co-planar with the lateral surface 144 of the substrate unit 102. The filler member 304 can be formed from a metal, a metal alloy, a matrix with a metal or a metal alloy dispersed therein, or another suitable electrically conductive material, in which case the connection surface S2 of the grounding element 118b includes the substantially planar, lateral surface of the filler member 304 as well as the substantially planar, lateral surfaces of the upper via pad remnant 146b, the lower via pad remnant 148b, and the plated channel remnant 150b. Advantageously, the inclusion of an electrically conductive, filler member 304 provides a relatively large area of the connection surface S2 as well as improved structural rigidity for the grounding element 118b, thereby enhancing reliability and efficiency of electrical connections for reducing EMI. It is also contemplated that the filler member 304 can be formed from an electrically non-conductive material, in which case the connection surface S2 of the grounding element 118b includes the substantially planar, lateral surfaces of the upper via pad remnant 146b, the lower via pad remnant 148b, and the plated channel remnant 150b. The inclusion of an electrically non-conductive, filler member 304 can provide improved structural rigidity for the grounding element 118b, thereby enhancing reliability of electrical connections for reducing EMI. Still referring to FIG. 3C, formation of the EMI shield 124 yields the orthogonal lateral profile of the package 100 that is substantially planar and is substantially devoid of inward recessing in the lateral portion 128.

While the grounding element 118b is illustrated in FIG. 3B and FIG. 3C as fully extending across the thickness of the substrate unit 102, it is contemplated that the extent of the grounding element 118b can vary for other implementations. In particular and as further described below, the grounding element 118b can partially extend across the thickness of the substrate unit 102, and can be implemented as, for example, a remnant of a blind grounding via or an internal grounding via.

Figure 4A:
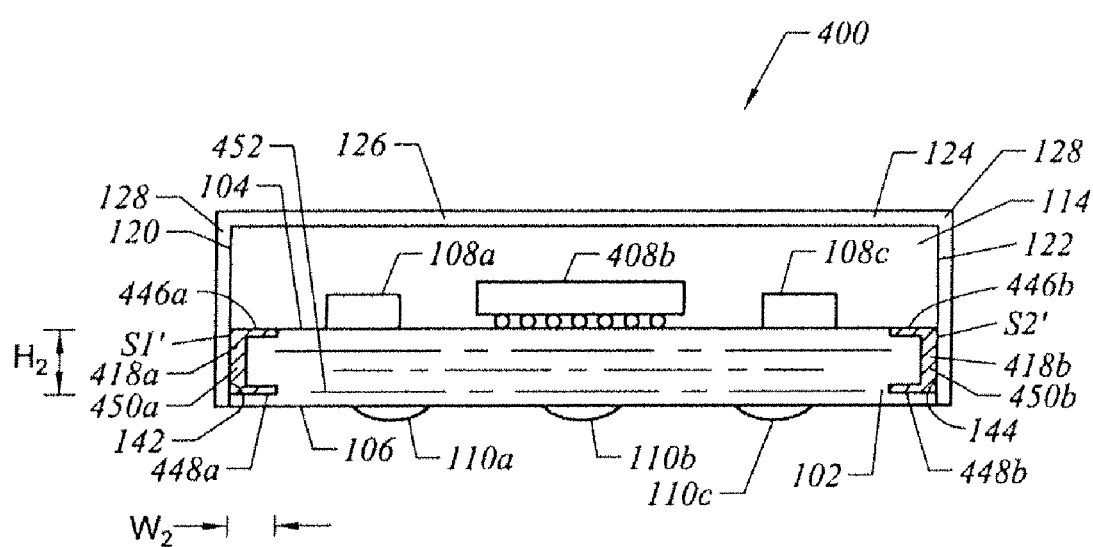
FIG. 4A illustrates a cross-sectional view of a semiconductor device package implemented in accordance with another embodiment of the invention.

FIG. 4A illustrates a cross-sectional view of a semiconductor device package 400 implemented in accordance with another embodiment of the invention. Certain aspects of the package 400 are implemented in a similar manner as previously described for the package 100 of FIG. 1 through FIG. 3C and, thus, are not further described herein.

Referring to FIG. 4A, the package 400 includes grounding elements 418a and 418b, which are disposed substantially at the periphery of the substrate unit 102. In the illustrated embodiment, the grounding elements 418a and 418b are implemented as remnants of blind grounding vias that extend between the upper surface 104 of the substrate unit 102 and an electrically conductive layer 452, which is disposed between the upper surface 104 and the lower surface 106 of the substrate unit 102 and serves as an internal grounding layer. In particular, each of the grounding elements 418a and 418b includes an upper via pad remnant 446a or 446b, which is disposed adjacent to the upper surface 104 of the substrate unit 102, a lower via pad remnant 448a or 448b, which is electrically connected to the electrically conductive layer 452 and is disposed above and at a certain spacing apart from the lower surface 106 of the substrate unit 102, and a plated channel remnant 450a or 450b, which extends between the upper via pad remnant 446a or 446b and the lower via pad remnant 448a or 448b. While the grounding elements 418a and 418b are illustrated as partially extending between the upper surface 104 and the lower surface 106 of the substrate unit 102, it is contemplated that the extent of the grounding elements 418a and 418b can vary for other implementations. In the illustrated embodiment, the grounding elements 418a and 418b include connection surfaces S1' and S2', respectively, which are electrically exposed adjacent to the lateral surfaces 142 and 144, respectively. Advantageously, the relatively large areas of the connection surfaces S1' and S2' can enhance reliability and efficiency of electrical connections for reducing EMI. For certain implementations, a height $H_2$ of the grounding elements 418a and 418b can be somewhat less than the thickness of the substrate unit 102, and can be in the range of about 0.1 mm to about 1.8 mm, such as from about 0.2 mm to about 1 mm or from about 0.3 mm to about 0.5 mm. A width $W_2$ of the grounding elements 418a and 418b, namely a lateral extent adjacent to the upper surface 104, can be in the range of about 75 µm to about 275 µm, such as from about 100 µm to about 250 µm or from about 125 µm to about 225 µm.

As illustrated in FIG. 4A, the package 400 also includes a semiconductor device 408b, which is a semiconductor chip that is disposed adjacent to the upper surface 104 of the substrate unit 102. In the illustrated embodiment, the semiconductor device 408b is flip chip-bonded to the substrate unit 102, such as via a set of solder bumps. It is contemplated that the semiconductor device 408b can be electrically connected to the substrate unit 102 in another manner, such as by wire-bonding.

Figure 4B:
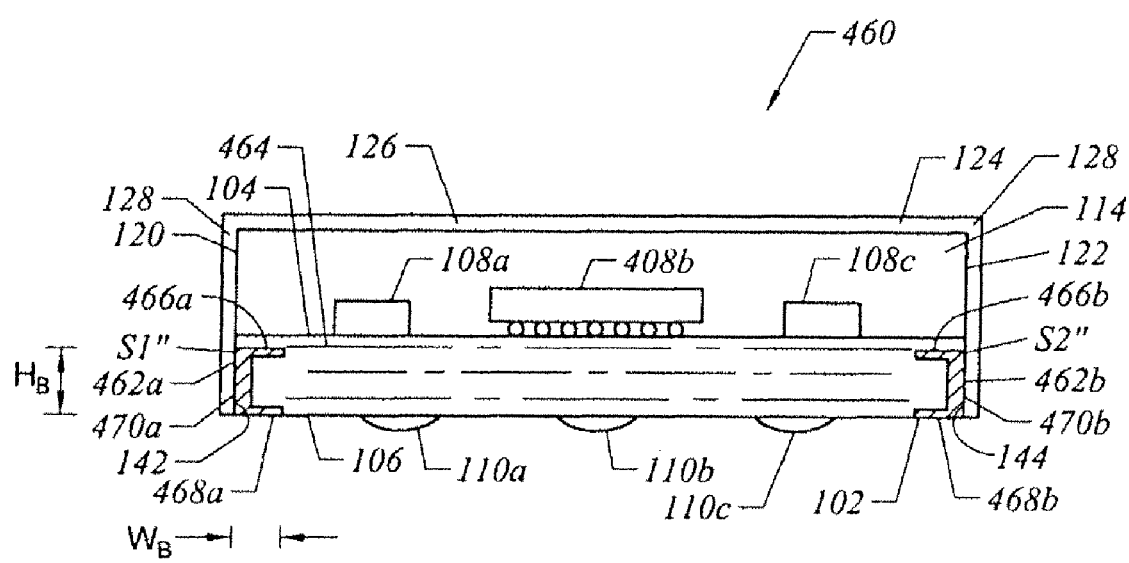
FIG. 4B illustrates a cross-sectional view of a semiconductor device package implemented in accordance with another embodiment of the invention.

FIG. 4B illustrates a cross-sectional view of a semiconductor device package 460 implemented in accordance with another embodiment of the invention. Certain aspects of the package 460 are implemented in a similar manner as previously described for the package 100 of FIG. 1 through FIG. 3C and the package 400 of FIG. 4A and, thus, are not further described herein.

Referring to FIG. 4B, the package 460 includes grounding elements 462a and 462b, which are disposed substantially at the periphery of the substrate unit 102. In the illustrated embodiment, the grounding elements 462a and 462b are implemented as remnants of blind grounding vias that extend between the lower surface 106 of the substrate unit 102 and an electrically conductive layer 464, which is disposed between the upper surface 104 and the lower surface 106 of the substrate unit 102 and serves as an internal grounding layer. In particular, each of the grounding elements 462a and 462b includes an upper via pad remnant 466a or 466b, which is electrically connected to the electrically conductive layer 464 and is disposed below and at a certain spacing apart from the upper surface 104 of the substrate unit 102, a lower via pad remnant 468a or 468b, which is disposed adjacent to the lower surface 106 of the substrate unit 102, and a plated channel remnant 470a or 470b, which extends between the upper via pad remnant 466a or 466b and the lower via pad remnant 468a or 468b. Advantageously, the positioning of the grounding elements 462a and 462b below the upper surface 104 of the substrate unit 102 conserves valuable area of the upper surface 104 that would otherwise be taken up for EMI shielding functionality, and, in turn, allows a reduced overall package size by reducing or minimizing a footprint area of the package 460. However, it is contemplated that the positioning and extent of the grounding elements 462a and 462b can vary for other implementations. In the illustrated embodiment, the grounding elements 462a and 462b include connection surfaces S1" and S2", respectively, which are electrically exposed adjacent to the lateral surfaces 142 and 144, respectively. Advantageously, the relatively large areas of the connection surfaces S1" and S2" can enhance reliability and efficiency of electrical connections for reducing EMI, while achieving the goal of a reduced overall package size. For certain implementations, a height $H_B$ of the grounding elements 462a and 462b can be somewhat less than the thickness of the substrate unit 102, and can be in the range of about 0.1 mm to about 1.8 mm, such as from about 0.2 mm to about 1 mm or from about 0.3 mm to about 0.5 mm. A width $W_B$ of the grounding elements 462a and 462b, namely a lateral extent adjacent to the lower surface 106, can be in the range of about 75 µm to about 275 µm, such as from about 100 µm to about 250 µm or from about 125 µm to about 225 µm.

Figure 4C:
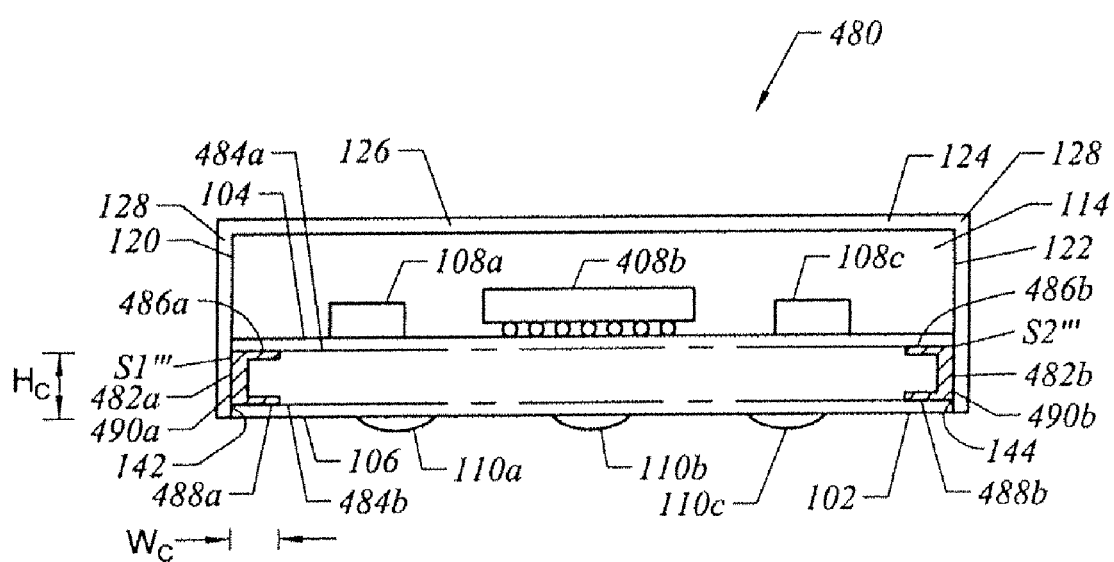
FIG. 4C illustrates a cross-sectional view of a semiconductor device package implemented in accordance with another embodiment of the invention.

FIG. 4C illustrates a cross-sectional view of a semiconductor device package 480 implemented in accordance with another embodiment of the invention. Certain aspects of the package 480 are implemented in a similar manner as previously described for the package 100 of FIG. 1 through FIG. 3C, the package 400 of FIG. 4A, and the package 460 of FIG. 4B and, thus, are not further described herein.

Referring to FIG. 4C, the package 480 includes grounding elements 482a and 482b, which are disposed substantially at the periphery of the substrate unit 102. In the illustrated embodiment, the grounding elements 482a and 482b are implemented as remnants of buried or internal grounding vias that extend between a pair of electrically conductive layers 484a and 484b, which are disposed between the upper surface 104 and the lower surface 106 of the substrate unit 102 and serve as a pair of internal grounding layers. In particular, each of the grounding elements 482a and 482b includes an upper via pad remnant 486a or 486b, which is electrically connected to the electrically conductive layer 484a and is disposed below and at a certain spacing apart from the upper surface 104 of the substrate unit 102, a lower via pad remnant 488a or 488b, which is electrically connected to the electrically conductive layer 484b and is disposed above and at a certain spacing apart from the lower surface 106 of the substrate unit 102, and a plated channel remnant 490a or 490b, which extends between the upper via pad remnant 486a or 486b and the lower via pad remnant 488a or 488b. Advantageously, the positioning of the grounding elements 482a and 482b between the upper surface 104 and the lower surface 106 of the substrate unit 102 conserves valuable area of both the upper surface 104 and the lower surface 106 that would otherwise be taken up for EMI shielding functionality, and, in turn, allows a reduced overall package size by reducing or minimizing a footprint area of the package 480. However, it is contemplated that the positioning and extent of the grounding elements 482a and 482b can vary for other implementations. In the illustrated embodiment, the grounding elements 482a and 482b include connection surfaces S1''' and S2''', respectively, which are electrically exposed adjacent to the lateral surfaces 142 and 144, respectively. Advantageously, the relatively large areas of the connection surfaces S1''' and S2''' can enhance reliability and efficiency of electrical connections for reducing EMI, while achieving the goal of a reduced overall package size. For certain implementations, a height $H_C$ of the grounding elements 482a and 482b can be somewhat less than the thickness of the substrate unit 102, and can be in the range of about 0.1 mm to about 1.6 mm, such as from about 0.2 mm to about 0.8 mm or from about 0.2 mm to about 0.4 mm. A width $W_C$ of the grounding elements 482a and 482b, namely a lateral extent adjacent to the electrically conductive layer 484a or 484b, can be in the range of about 75 µm to about 275 µm, such as from about 100 µm to about 250 µm or from about 125 µm to about 225 µm.

FIG. 5A through FIG. 5E illustrate a method of forming a semiconductor device package, according to an embodiment of the invention. For ease of presentation, the following manufacturing operations are described with reference to the package 100 of FIG. 1 through FIG. 3C. However, it is contemplated that the manufacturing operations can be similarly carried out to form other semiconductor device packages, such as the package 400 of FIG. 4A, the package 460 of FIG. 4B, and the package 480 of FIG. 4C.

Referring first to FIG. 5A and FIG. 5B, a substrate 500 is provided. To enhance manufacturing throughput, the substrate 500 includes multiple substrate units, including the substrate unit 102 and an adjacent substrate unit 102', thereby allowing certain of the manufacturing operations to be readily performed in parallel or sequentially. The substrate 500 can be implemented in a strip manner, in which the multiple substrate units are arranged sequentially in a linear fashion, or in an array manner, in which the multiple substrate units are arranged in a two-dimensional fashion. For ease of presentation, the following manufacturing operations are primarily described with reference to the substrate unit 102 and related components, although the manufacturing operations can be similarly carried for other substrate units and related components.

As illustrated in FIG. 5A and FIG. 5B, multiple grounding vias are disposed adjacent to a periphery of each substrate unit. In particular, grounding vias 502a, 502b, 502c, 502d, and 502e are disposed adjacent to sides of the substrate unit 102. In the illustrated embodiment, each grounding via includes an upper via pad, such as an upper via pad 546a or 546b, a lower via pad, such as a lower via pad 548a or 548b, and a plated channel, such as a plated channel 550a or 550b. The grounding vias 502a, 502b, 502c, 502d, and 502e can be formed in any of a number of ways, such as photolithography, chemical etching, laser drilling, or mechanical drilling to form openings, along with plating of the openings using a metal, a metal alloy, a matrix with a metal or a metal alloy dispersed therein, or another suitable electrically conductive material. Plating of the openings can be carried out to a thickness in the range of about 1 µm to about 20 µm, such as from about 5 µm to about 20 µm or from about 10 µm to about 15 µm, while leaving via channels that extend substantially across vertical extents of the grounding vias 502a, 502b, 502c, 502d, and 502e. For certain implementations, an electrically conductive material can be applied to and drawn into the via channels so as to form electrically conductive, core members that are accommodated by and substantially fill the via channels. For example, the electrically conductive material can include a metal, such as copper, a solder, such as any of a number of fusible metal alloys having melting points in the range of about 90° C. to about 450° C., or an electrically conductive adhesive, such as silver glue, epoxy with a copper filler, or any of a number of other resins having an electrically conductive filler dispersed therein. For other implementations, an electrically non-conductive material can be applied to and drawn into the via channels so as to form electrically non-conductive, core members that are accommodated by and substantially fill the via channels. For example, the electrically non-conductive material can include a solder mask, an electrically non-conductive adhesive, such as epoxy substantially devoid of an electrically conductive filler, or any of a number of other suitable resins. Filling the via channels can yield larger areas for resulting connection surfaces, enhanced structural rigidity, or both, thereby further enhancing reliability and efficiency of electrical connections for reducing EMI. While the grounding vias 502a, 502b, 502c, 502d, and 502e are illustrated as fully extending between an upper surface 504 and a lower surface 524 of the substrate 500, it is contemplated that the extent of the grounding vias 502a, 502b, 502c, 502d, and 502e can vary for other implementations. For example, it is contemplated that at least one of the grounding vias 502a, 502b, 502c, 502d, and 502e can be implemented as a blind grounding via or an internal grounding via.

In the illustrated embodiment, a via pad, such as the upper via pad 546a or 546b, has an annular shape, and a plated channel, such as the plated channel 550a or 550b, defines a via channel that is shaped in the form of a circular cylinder, including a substantially circular cross-section. It is contemplated that the shapes of a via pad and a via channel, in general, can be any of a number of shapes. For example, a via channel can have another type of cylindrical shape, such as an elliptic cylindrical shape, a square cylindrical shape, or a rectangular cylindrical shape, or can have a non-cylindrical shape, such as a cone, a funnel, or another tapered shape. It is also contemplated that lateral surfaces of a via channel can be curved or roughly textured. For certain implementations, a lateral extent $W_3$ of each via channel (also sometimes referred to as a via size) can be in the range of about 50 µm to about 350 µm, such as from about 100 µm to about 300 µm or from about 150 µm to about 250 µm, while a lateral extent $W_4$ of each via pad (also sometimes referred to as a via pad size) can be in the range of about 150 µm to about 550 µm, such as from about 200 µm to about 500 µm or from about 250 µm to about 450 µm. If a via channel or a via pad has a non-uniform shape, the lateral extent $W_3$ or $W_4$ can correspond to, for example, an average of lateral extents along orthogonal directions.

To enhance reliability and efficiency of electrical connections for reducing EMI, grounding vias are disposed adjacent to all four sides of each substrate unit, although the grounding vias also can be disposed adjacent to a subset of the four sides. It is also contemplated that grounding vias can be disposed adjacent to all four corners of each substrate unit or a subset of the four corners. For certain implementations, a spacing $L_1$ of nearest-neighbor grounding vias of a substrate unit (also sometimes referred to as a via pitch) can be in the range of about 0.1 mm to about 3 mm, such as from about 0.2 mm to about 2 mm or from about 0.5 mm to about 1.5 mm. Referring to FIG. 5B, a dashed boundary within each substrate unit defines a "keep-out" portion, within which semiconductor devices are disposed. To reduce or minimize adverse impact on the operation of semiconductor devices, grounding vias of a substrate unit can be spaced apart from the "keep-out" portion by a spacing $L_2$ (also sometimes referred to as a "keep-out" distance). For certain implementations, the spacing $L_2$ can be in the range of about 50 µm to about 300 µm, such as from about 50 µm to about 200 µm or from about 100 µm to about 150 µm. It is contemplated that the number of grounding vias and their positioning within the substrate 500 can vary from that illustrated in FIG. 5A and FIG. 5B. It is also contemplated that multiple rows of grounding vias can be disposed adjacent to a periphery of each substrate unit. It is further contemplated that the spacing $L_2$ need not be allocated in the case of blind grounding vias, which are disposed below the upper surface 504, or in the case of internal grounding vias. In particular, such blind or internal grounding vias can be partially or fully disposed within the "keep-out" portion and below semiconductor devices, so as to reduce or minimize adverse impact on the operation of the semiconductor devices while achieving the goal of a reduced overall package size.

Once the substrate 500 is provided, the semiconductor devices 108a, 108b, and 108c are disposed adjacent to the upper surface 504 of the substrate 500, and are electrically connected to the substrate unit 102. In particular, the semiconductor device 108b is wire-bonded to the substrate unit 102 via the wires 112, and the semiconductor devices 108a and 108c are surface mounted to the substrate unit 102. Referring to FIG. 5A, the lower surface 524 of the substrate 500 is disposed adjacent to a tape 506, which can be implemented as a single-sided or double-sided adhesive tape. Advantageously, the tape 506 secures the substrate unit 102 with respect to adjacent substrate units, and allows various subsequent operations to be carried out with those components disposed adjacent to the tape 506, without requiring inversion or transfer to a separate carrier.

Next, as illustrated in FIG. 5C, a molding material 514 is applied to the upper surface 504 of the substrate 500 so as to substantially cover or encapsulate the grounding vias 502a and 502b, the semiconductor devices 108a, 108b, and 108c, and the wires 112. The molding material 514 can include, for example, a Novolac-based resin, an epoxy-based resin, a silicone-based resin, or another suitable encapsulant. Suitable fillers also can be included, such as powdered $SiO_2$. The molding material 514 can be applied using any of a number of molding techniques, such as compression molding, injection molding, and transfer molding. Once applied, the molding material 514 is hardened or solidified, such as by lowering the temperature to below a melting point of the molding material 514, thereby forming a molded structure 526. To facilitate proper positioning of the substrate 500 during subsequent singulation operations, fiducial marks can be formed in the molded structure 526, such as using laser marking. Alternatively, or in conjunction, fiducial marks can be formed adjacent to a periphery of the substrate 500.

Singulation is next carried out with respect to an upper surface 516 of the molded structure 526. Such manner of singulation can be referred to as "front-side" singulation. Referring to FIG. 5C and FIG. 5D, the "front-side" singulation is carried out using a saw 518, which forms cutting slits, including cutting slits 520a and 520b. In particular, the cutting slits 520a and 520b extend downwardly and completely through the molded structure 526 and the substrate 500 and partially through the tape 506, thereby sub-dividing the molded structure 526 and the substrate 500 into discrete units, including the package body 114 and the substrate unit 102. Such manner of singulation can be referred to as "full-cut" singulation, since sub-division of the molded structure 526 and the substrate 500 at each of various locations can occur through one singulation operation, rather than multiple singulation operations, such as multiple "half-cut" singulations. Advantageously, the use of "full-cut" singulation, rather than "half-cut" singulation, enhances manufacturing throughput by reducing the number of singulation operations and the time involved for those operations. Also, manufacturing cost is reduced by enhancing an utilization ratio of the substrate 500, and an overall yield rate is enhanced by reducing the probability of defects resulting from sawing errors. As illustrated in FIG. 5D, the tape 506 secures the substrate unit 102 and the package body 114 with respect to adjacent substrate units and package bodies during the "full-cut" singulation.

Still referring to FIG. 5D, the saw 518 is laterally positioned and substantially aligned with each grounding via, such that a resulting cutting slit removes a certain volume or weight percentage of the grounding via, such as from about 10 percent to about 90 percent, from about 30 percent to about 70 percent, or from about 40 percent to about 60 percent by volume or by weight. If core members are included, a resulting cutting slit also removes a certain volume or weight percentage of each core member, such as from about 10 percent to about 90 percent, from about 30 percent to about 70 percent, or from about 40 percent to about 60 percent by volume or by weight. In such manner, the grounding elements 118a and 118b are formed and include the connection surfaces S1 and S2, respectively, which are exposed to the surroundings at the periphery of the substrate unit 102. The alignment of the saw 518 during singulation can be aided by fiducial marks, which allow proper positioning of the saw 518 when forming the cutting slits 520a and 520b. For certain implementations, a width $C_1$ of each of the cutting slits 520a and 520b (also sometimes referred to as a full-cut width or full-cut sawing street) can be in the range of about 100 μm to about 600 μm, such as from about 200 μm to about 400 μm or from about 250 μm to about 350 μm.

Figure 5E:
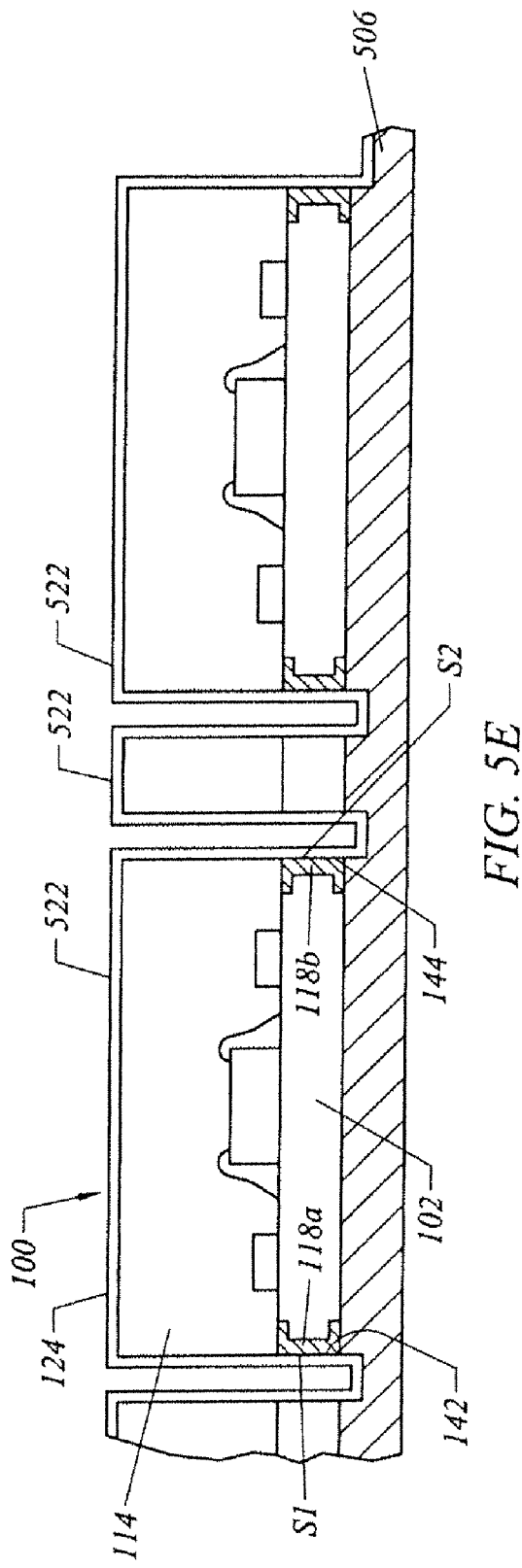

Next, as illustrated in FIG. 5E, an EMI coating 522 is formed adjacent to exposed surfaces, including the exterior surfaces of the package body 114, the connection surfaces S1 and S2 of the grounding elements 118a and 118b, and the lateral surfaces 142 and 144 of the substrate unit 102. The EMI coating 522 can be formed using any of a number of coating techniques, such as chemical vapor deposition, electroless plating, electrolytic plating, printing, spraying, sputtering, and vacuum deposition. For example, the EMI coating 522 can include a single layer that is formed from nickel using electroless plating and with a thickness of at least about 5 μm, such as from about 5 μm to about 50 μm or from about 5 μm to about 10 μm. If the EMI coating 522 is multi-layered, different layers can be formed using the same coating technique or different coating techniques. For example, an inner layer can be formed from copper using electroless plating, and an outer layer can be formed from nickel using either electroless plating or electrolytic plating. As another example, an inner layer (serving as a base layer) can be formed from copper using either sputtering or electroless plating and with a thickness of at least about 1 μm, such as from about 1 μm to about 50 μm or from about 1 μm to about 10 μm, and an outer layer (serving as an anti-oxidation layer) can be formed from stainless steel, nickel, or copper using sputtering and with a thickness no greater than about 1 μm, such as from about 0.01 μm to about 1 μm or from about 0.01 μm to about 0.1 μm. In these examples, surfaces to which the EMI coating 522 is applied can be subjected to certain pre-treatment operations to facilitate formation of the inner layer and the outer layer. Examples of such pre-treatment operations include surface roughening, such as by chemical etching or mechanical abrasion, and formation of a seed layer. Separating the substrate unit 102 and related components from the tape 506, such as using a pick-and-place technique, results in the package 100 including the EMI shield 124.

Figure 6:
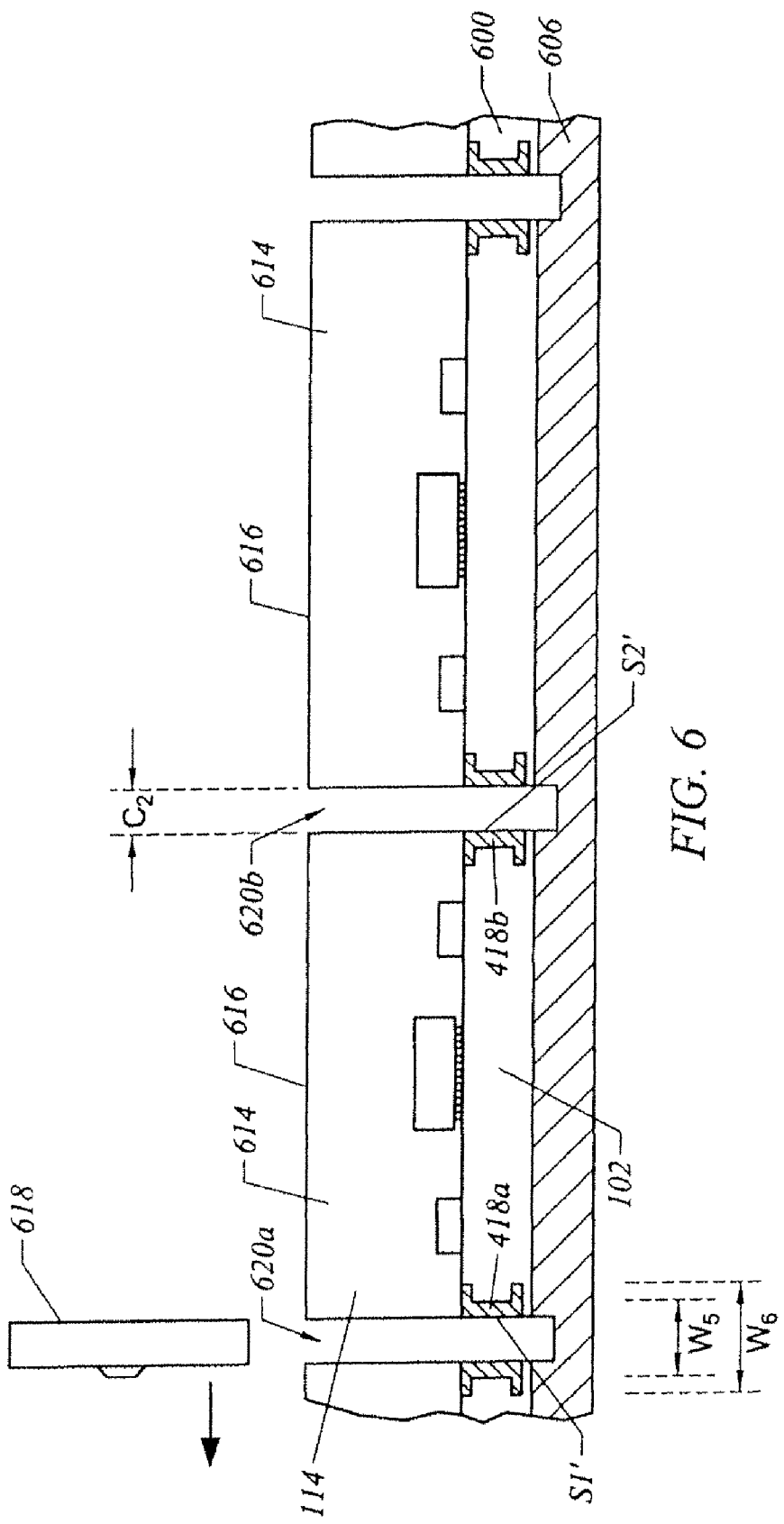
FIG. 6 illustrates a method of forming the semiconductor device package of FIG. 4A, according to another embodiment of the invention.

FIG. 6 illustrates a method of forming a semiconductor device package, according to another embodiment of the invention. For ease of presentation, the following manufacturing operations are described with reference to the package 400 of FIG. 4A. However, it is contemplated that the manufacturing operations can be similarly carried out to form other semiconductor device packages, such as the package 100 of FIG. 1 through FIG. 3C, the package 460 of FIG. 4B, and the package 480 of FIG. 4C. Also, certain aspects of the manufacturing operations are implemented in a similar manner as previously described for FIG. 5A through FIG. 5E and, thus, are not further described herein.

Referring to FIG. 6, a substrate 600 along with a hardened molding material 614 are disposed adjacent to a tape 606, which can be implemented as a single-sided or double-sided adhesive tape. Singulation is next carried out with respect to an upper surface 616 of the hardened molding material 614. As illustrated in FIG. 6, the singulation is carried out using a saw 618, which forms cutting slits 620a and 620b that extend downwardly and completely through the hardened molding material 614 and the substrate 600 and partially through the tape 606, thereby sub-dividing the hardened molding material 614 and the substrate 600 into discrete units, including the package body 114 and the substrate unit 102. In particular, the saw 618 is laterally positioned and substantially aligned with each grounding via, such that a resulting cutting slit sub-divides the grounding via into two grounding elements that are separated from one another and are disposed adjacent to respective substrate units. If core members are included, a resulting cutting slit also sub-divides each core member into two filler members. In such manner, the grounding elements 418a and 418b are formed and include the connection surfaces S1' and S2', respectively, which are exposed to the surroundings at the periphery of the substrate unit 102. Advantageously, the manner of singulation illustrated in FIG. 6 enhances manufacturing throughput by further reducing the number of singulation operations and the time involved for those operations, reduces manufacturing cost by further enhancing an utilization ratio of the substrate 600, and enhances an overall yield rate by further reducing the probability of defects resulting from sawing errors. For certain implementations, a via size $W_5$ of each grounding via can be in the range of about 100 µm to about 700 µm, such as from about 200 µm to about 600 µm or from about 300 µm to about 500 µm, while a via pad size $W_6$ of each grounding via can be in the range of about 300 µm to about 1,100 µm, such as from about 400 µm to about 1,000 µm or from about 500 µm to about 900 µm. A width $C_2$ of each of the cutting slits 620a and 620b can be substantially the same as the width $C_1$ previously described above with reference to FIG. 5D, and can be in the range of about 100 µm to about 600 µm, such as from about 200 µm to about 400 µm or from about 250 µm to about 350 µm. However, it is contemplated that the width $C_2$ can vary for other implementations, and can be adjusted relative to the via size $W_5$ or the via pad size $W_6$ of a grounding via to allow its sub-division into multiple grounding elements. For example, the width $C_2$, in general, can be represented as: $C_2 < W_5 < W_6$.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
   a substrate unit including an upper surface, a lower surface, a lateral surface disposed adjacent to a periphery of the substrate unit and fully extending between the upper surface and the lower surface of the substrate unit, and a grounding element disposed adjacent to the periphery of the substrate unit and at least partially extending between the upper surface and the lower surface of the substrate unit, the grounding element including an indented portion that is disposed adjacent to the lateral surface of the substrate unit;
   a semiconductor device electrically connected to the substrate unit;
   a package body disposed adjacent to the upper surface of the substrate unit and encapsulating the semiconductor device, the package body including exterior surfaces that include a lateral surface; and
   an electromagnetic interference shield disposed adjacent to the exterior surfaces of the package body and the lateral surface of the substrate unit, the electromagnetic interference shield being electrically connected to the grounding element;
   wherein the grounding element includes a connection surface that is inwardly recessed relative to the lateral surface of the substrate unit, and the electromagnetic interference shield conformally coats the connection surface.

2. The semiconductor device package of claim 1, wherein the grounding element includes a plated channel remnant that corresponds to the indented portion of the grounding element, and a filler material located within the indented portion.

3. The semiconductor device package of claim 1, wherein the grounding element partially extends between the upper surface and the lower surface of the substrate unit, such that a height of the grounding element is less than a thickness of the substrate unit.

4. The semiconductor device package of claim 1, wherein the lateral surface of the substrate unit is substantially planar, and the lateral surface of the package body is substantially aligned with the lateral surface of the substrate unit.

5. The semiconductor device package of claim 1, wherein the grounding element further includes a non-conductive filler material located within the indented portion.

6. A semiconductor device package, comprising:
   a substrate unit including an upper surface, a lower surface, a lateral surface disposed adjacent to a periphery of the substrate unit and fully extending between the upper surface and the lower surface of the substrate unit, and a grounding element disposed adjacent to the periphery of the substrate unit and at least partially extending between the upper surface and the lower surface of the substrate unit, the grounding element including an indented portion that is disposed adjacent to the lateral surface of the substrate unit;
   a semiconductor device electrically connected to the substrate unit;
   a package body disposed adjacent to the upper surface of the substrate unit and encapsulating the semiconductor device, the package body including exterior surfaces that include a lateral surface; and
   an electromagnetic interference shield disposed adjacent to the exterior surfaces of the package body and the lateral surface of the substrate unit, the electromagnetic interference shield being electrically connected to the grounding element;
   wherein the grounding element partially extends between the upper surface and the lower surface of the substrate unit, such that a height of the grounding element is less than a thickness of the substrate unit; and
   wherein the substrate unit includes a pair of internal grounding layers, and the grounding element extends between the pair of internal grounding layers.

7. The semiconductor device package of claim 6, wherein the grounding element includes a connection surface that is inwardly recessed relative to the lateral surface of the substrate unit, and the electromagnetic interference shield conformally coats the connection surface.

8. A semiconductor device package, comprising:
   a substrate including a first surface, a second opposing surface, and a grounding element at least partially extending between the first surface and the second opposing surface of the substrate, the grounding element including a plated channel remnant and a filler member, the plated channel remnant being inwardly recessed so as to accommodate the filler member, the plated channel remnant and the filler member defining a lateral surface of the grounding element that is disposed adjacent to a periphery of the substrate;
   a semiconductor device electrically connected to the substrate;
   a package body disposed adjacent to the first surface of the substrate and encapsulating the semiconductor device, the package body including exterior surfaces; and
   an electromagnetic interference shield disposed adjacent to the exterior surfaces of the package body and electrically connected to the lateral surface of the grounding element, wherein a lateral profile of the semiconductor device package is substantially planar and is substantially orthogonal with respect to the second opposing surface of the substrate;
wherein the lateral surface of the grounding element is substantially planar.

9. The semiconductor device package of claim 8, wherein the grounding element partially extends between the first surface and the second opposing surface of the substrate, such that a height of the grounding element is less than a thickness of the substrate.

10. The semiconductor device package of claim 8, wherein the filler member is electrically non-conductive.

11. The semiconductor device package of claim 8, wherein the substrate further includes a lateral surface fully extending between the first surface and the second opposing surface of the substrate, the lateral surface of the substrate is substantially planar and is substantially orthogonal with respect to the second opposing surface of the substrate, and the lateral surface of the grounding element is electrically exposed adjacent to the lateral surface of the substrate.

12. The semiconductor device package of claim 8, wherein the exterior surfaces of the package body include a lateral surface, and the lateral surface of the package body is substantially aligned with a lateral surface of the substrate.

13. The semiconductor device package of claim 8, wherein the grounding element further includes a first via pad remnant and a second via pad remnant, and the plated channel remnant extends between the first via pad remnant and the second via pad remnant.

14. The semiconductor device package of claim 13, wherein the substrate further includes an electrically conductive layer disposed between the first surface and the second opposing surface of the substrate, the first via pad remnant is disposed adjacent to the electrically conductive layer of the substrate, and the second via pad remnant is disposed adjacent to the second opposing surface of the substrate.

15. The semiconductor device package of claim 8, wherein the electromagnetic interference shield is a conformal shield that includes a first layer and a second layer disposed adjacent to the first layer.

16. The semiconductor device package of claim 15, wherein the first layer and the second layer include different electrically conductive materials.

17. A semiconductor package, comprising:
a substrate including a lateral surface and a grounding element including a partial annular portion recessed from the lateral surface of the substrate and a filler material disposed in a recess defined by the partial annular portion, wherein the partial annular portion has at least one sidewall exposed;
a package body disposed adjacent to an upper surface of the substrate, the package body including exterior surfaces that include a lateral surface; and
a shielding layer disposed adjacent to the exterior surfaces of the package body and the lateral surface of the substrate, wherein the shielding layer is physically connected to the at least one sidewall of the partial annular portion;
wherein the partial annular portion and the filler material define a lateral surface of the grounding element that is disposed adjacent to the lateral surface of the substrate, and that is substantially planar.

18. The semiconductor package of claim 17, wherein the grounding element partially extends between the upper surface and a lower surface of the substrate, such that a height of the grounding element is less than a thickness of the substrate.

19. The semiconductor package of claim 17, wherein the filler material is electrically non-conductive.

20. The semiconductor package of claim 17, wherein the lateral surface of the substrate fully extends between a first surface and a second opposing surface of the substrate, and the lateral surface of the substrate is substantially planar.

* * * * *